United States Patent
Liu (10) Patent No.: US 11,049,816 B2
(45) Date of Patent: Jun. 29, 2021

(54) ALIGNMENT MARK AND SEMICONDUCTOR DEVICE, AND FABRICATION METHODS THEREOF

(71) Applicant: Ningbo Semiconductor International Corporation, Ningbo (CN)

(72) Inventor: Mengbin Liu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 54 days.

(21) Appl. No.: 16/236,568

(22) Filed: Dec. 30, 2018

(65) Prior Publication Data

US 2020/0161251 A1  May 21, 2020

Related U.S. Application Data

(63) Continuation of application No. PCT/CN2018/120714, filed on Dec. 12, 2018.

(30) Foreign Application Priority Data

Nov. 20, 2018 (CN) .......................... 201811384953.7

(51) Int. Cl.
*H01L 23/544* (2006.01)
*B81C 99/00* (2010.01)
(Continued)

(52) U.S. Cl.
CPC .......... *H01L 23/544* (2013.01); *B81C 99/007* (2013.01); *H01L 21/67282* (2013.01);
(Continued)

(58) Field of Classification Search
None
See application file for complete search history.

(56) References Cited

U.S. PATENT DOCUMENTS

| 8,496,767 B2 * | 7/2013 | Kawada | .................. C03C 27/06 |
| | | | 156/64 |
| 2006/0102987 A1 * | 5/2006 | Saiki | ................. H01L 21/67282 |
| | | | 257/632 |

(Continued)

FOREIGN PATENT DOCUMENTS

| CN | 101964338 A | 2/2011 |
| CN | 102263039 A | 11/2011 |

(Continued)

*Primary Examiner* — Steven M Christopher
(74) *Attorney, Agent, or Firm* — Anova Law Group, PLLC (57) ABSTRACT

An alignment mark, a semiconductor device, and fabrication methods of the alignment mark and the semiconductor device are provided. The method includes providing a first base substrate, and forming a plurality of alignment marks on the first base substrate. The method also includes dicing the first base substrate to form a plurality of alignment dies. Each alignment die includes a diced first base substrate and at least one alignment mark diced from the plurality of alignment marks on the diced first base substrate. In addition, the method includes providing a second base substrate for aligning, and forming a bonding film on the second base substrate. Further, the method includes attaching an alignment die of the plurality of alignment dies to the bonding film on an alignment region of the second base substrate using a die attach process.

19 Claims, 3 Drawing Sheets

(51) Int. Cl.
*H01L 21/78* (2006.01)
*H01L 21/67* (2006.01)

(52) U.S. Cl.
CPC ........ *H01L 21/78* (2013.01); *B81C 2203/054* (2013.01); *H01L 2223/54426* (2013.01)

(56) References Cited

U.S. PATENT DOCUMENTS

| | | | | |
|---|---|---|---|---|
| 2007/0066044 A1* | 3/2007 | Abe | ............... | H01L 23/3128 |
| | | | | 438/612 |
| 2019/0088548 A1* | 3/2019 | Shiomi | ............... | H01L 21/6836 |
| 2019/0245003 A1* | 8/2019 | Eum | ............... | H01L 27/14634 |

FOREIGN PATENT DOCUMENTS

| | | |
|---|---|---|
| CN | 105244307 A | 1/2016 |
| JP | 2007294575 A | 11/2007 |

\* cited by examiner

ALIGNMENT MARK AND SEMICONDUCTOR DEVICE, AND FABRICATION METHODS THEREOF

CROSS-REFERENCES TO RELATED APPLICATIONS

This application is a continuation application of PCT Patent Application No. PCT/CN2018/120714, filed on Dec. 12, 2018, which claims priority to Chinese patent applications No. 201811384953.7, filed on Nov. 20, 2018, the entirety of all of which is incorporated herein by reference.

FIELD OF THE DISCLOSURE

The present disclosure generally relates to the field of integrated circuit manufacturing technology and, more particularly, relates to an alignment mark, a semiconductor device, and fabrication methods of the alignment mark and the semiconductor device.

BACKGROUND

During semiconductor processes, two wafers often toned to be aligned and bonded with one another. Before aligning and bonding the two wafers together, at least two alignment marks have to be fabricated on a carrier wafer for aligning the carrier wafer with another wafer, and then a bonding film is laminated on the carrier wafer for bonding the carrier wafer to the another wafer. The bonding film covers the at least two alignment marks, and ultimately, the carrier wafer and the another wafer are aligned through the at least two alignment marks, and are bonded through the bonding film.

However, the transmittance of the bonding film is low. Because the bonding film covers the alignment mark, the capturing of the alignment mark of a subsequent device may be affected. Therefore, before performing the alignment, a portion of the bonding film covering the alignment mark has to be removed. Due to the capability of a film lamination machine, the to-be removed portion of the bonding film has be to centered by the alignment mark and then be cut out.

Therefore, approximately 6% of a single piece of the bonding film is wasted, and at the same time, a usable area of a single piece of the carrier wafer is also reduced by approximately 6% accordingly. Moreover, a specific mask needs to be fabricated for each type of machine used in semiconductor processes and for forming the alignment mark on the carrier wafer. This increases the production cost. Further, the formation of the alignment mark also occupies production resources, and a production cycle of the alignment mark on each piece of the carrier wafer may be about 48 hours.

The disclosed structure/device and their methods are directed to solve one or more problems set forth above and other problems in the art.

BRIEF SUMMARY OF THE DISCLOSURE

One aspect of the present disclosure includes a method for forming a semiconductor device. The method includes providing a first base substrate, and forming a plurality of alignment marks on the first base substrate. The method also includes dicing the first base substrate to form a plurality of alignment dies. Each alignment die includes a diced first base substrate and at least one alignment mark diced from the plurality of alignment marks on the diced first base substrate. In addition, the method includes providing a second base substrate for aligning, and forming a bonding film on the second base substrate. Further, the method includes attaching an alignment die of the plurality of alignment dies to the bonding film on an alignment region of the second base substrate using a die attach process.

Another aspect of the present disclosure includes a semiconductor device. The device includes a plurality of alignment dies, each including a diced first base substrate and at least one alignment mark on the diced first base substrate. The device also includes a second base substrate, and a bonding film on the second base substrate. An alignment die of the plurality of alignment dies are attached on the bonding film on an alignment region of the second base substrate for aligning the second base substrate.

Another aspect of the present disclosure includes a method for forming an alignment mark. The method includes providing a semiconductor material base substrate, and forming a plurality of alignment marks on the semiconductor material base substrate. The plurality of alignment marks are distributed throughout the semiconductor material base substrate. The method also includes dicing the semiconductor material base substrate to form a plurality of alignment dies.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. However, those skilled in the art may easily understand that the present disclosure may be implemented without one or more of these details. In certain examples, some well-known technical features in the art are not described herein to avoid confusion with the present disclosure.

Figure 1:
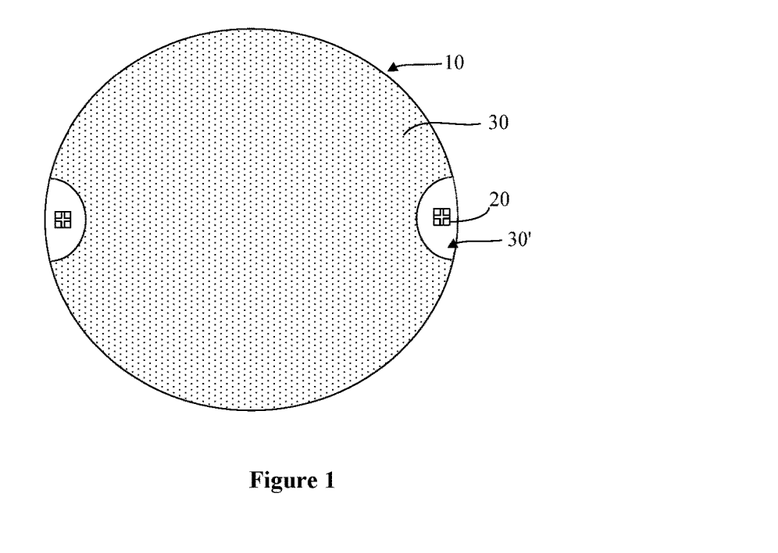
FIG. 1 illustrates a schematic diagram of a semiconductor device.

FIG. 1 illustrates a schematic diagram of a semiconductor device. Referring to FIG. 1, the semiconductor device includes a carrier wafer 10. Two alignment marks 20 are formed on the carrier wafer 10, and the two alignment marks 20 are formed on opposite sides of the carrier wafer 10, respectively, for implementing alignment of the carrier wafer 10 with another wafer. A bonding film 30 is formed to cover the carrier wafer 10 and the alignment marks 20 to implement bonding of the carrier wafer 10 with another wafer in a wafer bonding process.

However, the transmittance of a bonding film 30 is substantially low. To ensure that the device can capture the alignment marks during a subsequent alignment, a portion of the bonding film covering the alignment mark 20 has to be removed. Due to the physical limitations of a film lamination machine, for example, due to limitations in cutting precision of the film lamination machine, when cutting the bonding film 30, it is difficult to ensure that the bonding film over the alignment mark 20 is well cut off. When cutting the bonding film 30, a portion of the bonding film around the alignment mark 20 is often cut off to form a blank region 30' surrounding the alignment mark 20. In this case, the bonding film over the periphery of the alignment mark is wasted, and the usable area of the carrier wafer 10 is also reduced accordingly.

In addition, before aligning each carrier wafer, the alignment mark has to be formed on the each carrier wafer through a mask. A production cycle of the alignment mark on the each carrier wafer is 48 hours. The formation of the alignment mark also occupies production resources.

Accordingly, the present disclosure provides a method for forming a semiconductor device. The method includes providing a first base substrate, and forming a plurality of alignment marks on the first base substrate. The method also includes dicing the first base substrate to form a plurality of alignment dies. Each alignment die includes a diced first base substrate and at least one alignment mark diced from the plurality of alignment marks on the diced first base substrate. In addition, the method includes providing a second base substrate for aligning, and forming a bonding film on the second base substrate. Further, the method includes attaching an alignment die of the plurality of alignment dies to the bonding film on an alignment region of the second base substrate using a die attach process.

The present disclosure also provides a semiconductor device. The device includes a plurality of alignment dies, each including a diced first base substrate and at least one alignment mark on the diced first base substrate. The device also includes a second base substrate, and a bonding film on the second base substrate. An alignment die of the plurality of alignment dies are attached on the bonding film on an alignment region of the second base substrate for aligning the second base substrate.

The present disclosure also provides a method for forming an alignment mark. The method includes providing a semiconductor material base substrate, and forming a plurality of alignment marks on the semiconductor material base substrate. The plurality of alignment marks are distributed throughout the semiconductor material base substrate. The method also includes dicing the semiconductor material base substrate to form a plurality of alignment dies.

In the alignment mark, the semiconductor device, and the fabrication methods of the alignment mark and the semiconductor device mark in the disclosed embodiments, the plurality of alignment dies each including at least one alignment mark may be first formed. When the second base substrate desires to be aligned, the alignment die may desire to be attached onto the second base substrate. The alignment mark may not desire to be formed on the second base substrate using a mask every time, which may save the process steps, reduce the production cost, and improve the production efficiency. Moreover, before attaching the alignment die onto the second base substrate, the bonding film may be formed on the second base substrate. The alignment die may be formed on the bonding film, and, thus, the bonding film may be prevented from being cut. Therefore, the process steps may be saved, the bonding film may be saved, and at the same time, the usable area of the second base substrate may be improved.

The present disclosure may be implemented in various forms and is limited to the embodiments set forth herein. The disclosed embodiments may enable the present disclosure to be thorough and complete, and may fully convey the scope of the present disclosure to those skilled in the art. In the drawings, the size and relative dimensions of the layers and regions may be exaggerated for clarity. Wherever possible, the same reference numbers will be used throughout the drawings to refer to the same or the alike parts.

Figure 2:
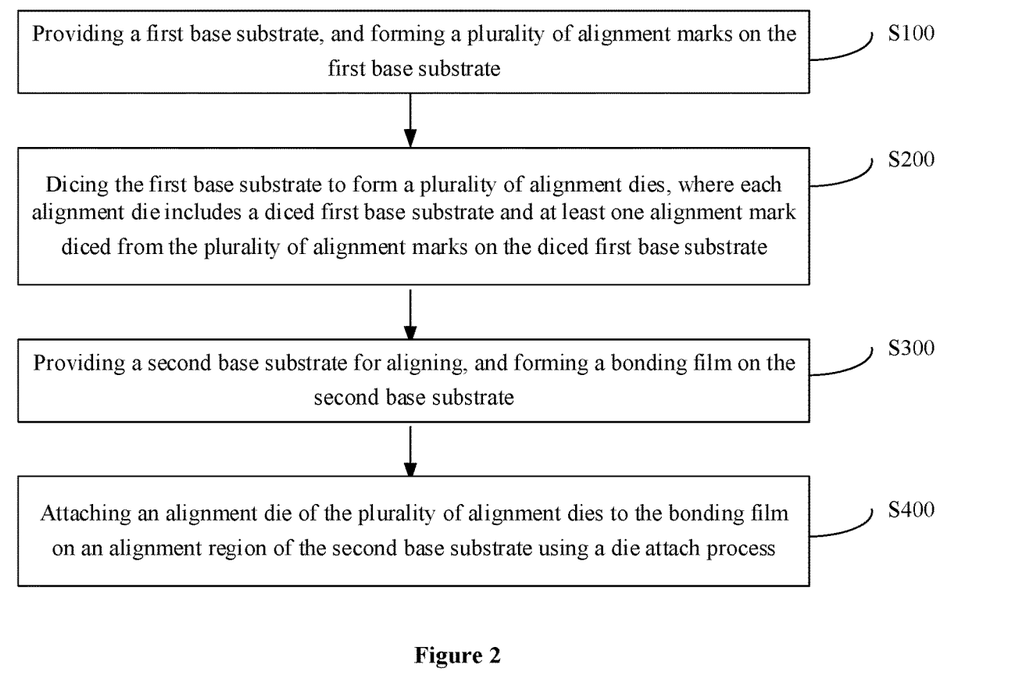
FIG. 2 illustrates a flow chart of an exemplary fabrication method for forming a semiconductor device consistent with various disclosed embodiments of the present disclosure.

FIG. 2 illustrates a flow chart of an exemplary fabrication method for forming a semiconductor device consistent with various disclosed embodiments of the present disclosure. Referring to FIG. 2, the fabrication method for forming the semiconductor device may include the following.

S100: Providing a first base substrate, and forming a plurality of alignment marks on the first base substrate;

S200: Dicing the first base substrate to form a plurality of alignment dies, where each alignment die may include a diced first base substrate and at least one alignment mark diced from the plurality of alignment marks on the diced first base substrate;

S300: Providing a second base substrate for aligning, and forming a bonding film on the second base substrate; and S400: Attaching an alignment die to the bonding film on an alignment region of the second base substrate using a die attach process.

Figure 3:
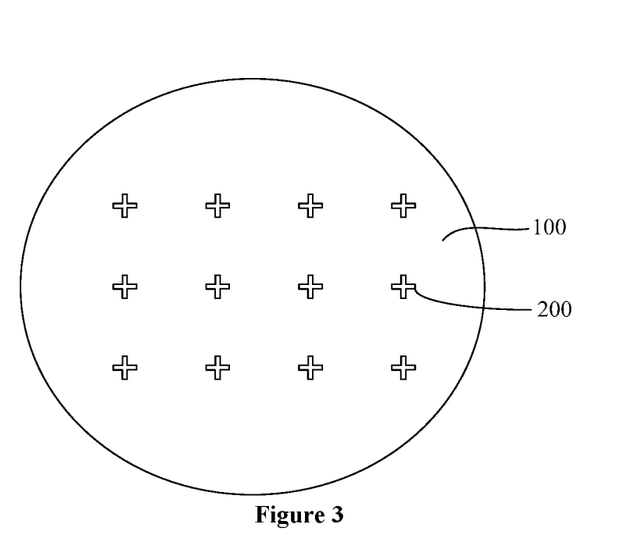
FIGS. 3-5 illustrate semiconductor structures corresponding to certain stages for forming an exemplary semiconductor device consistent with various disclosed embodiments of the present disclosure.
Figure 4:
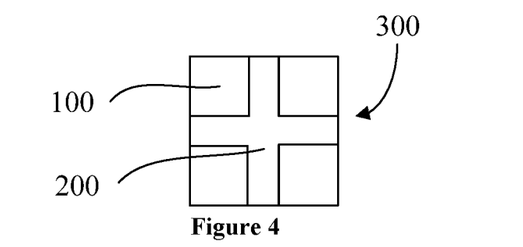
Figure 5:
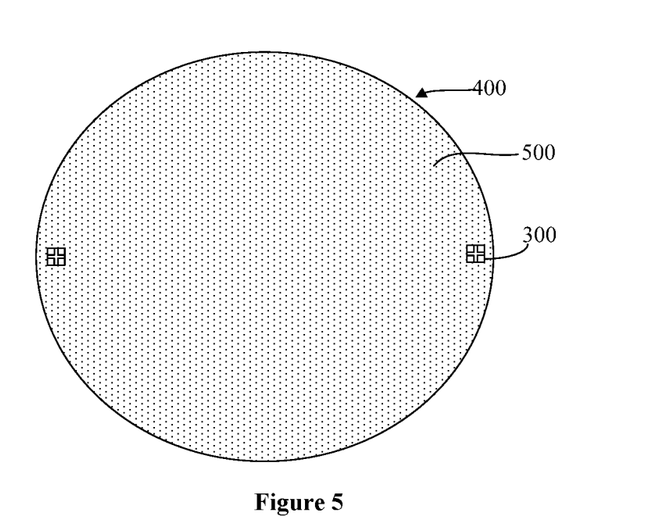

FIGS. 3-5 illustrate semiconductor structures corresponding to certain stages for forming the semiconductor device consistent with various disclosed embodiments of the present disclosure. The fabrication method for forming the semiconductor device in the present disclosure will be described in detail with reference to FIGS. 3-5.

A first base substrate 100 may be first provided. The first base substrate 100 may be a semiconductor material base substrate. In one embodiment, the first base substrate 100 may be a silicon base. In another embodiment, the first base substrate may be a germanium base, a germanium silicon base, a gallium arsenide base, or a silicon-on-insulator base. Those skilled in the art may select the material of the first base substrate as needed, and, thus, the type of the first base substrate 100 may not limit the scope of the present disclosure. In one embodiment, the first base substrate 100 may have a flat planar structure. Further, a top-view shape of the first base substrate 100 may be a circle shape, a rectangle shape, or any suitable shape, which is not limited by the present disclosure. In one embodiment, the first base substrate 100 may be a silicon base, and the first base substrate 100 may have a circle shape. The first base substrate 100 may be primarily used to carry alignment marks and may be subsequently diced to form the plurality of alignment dies, each including at least one alignment mark for alignment, and no semiconductor device structure may desire to be formed on the first base substrate 100.

Referring to FIG. 3, a plurality of alignment marks 200 may be formed on the first base substrate 100. In one embodiment, a light-shielding layer made of an opaque material may be formed on the first base substrate 100. In one embodiment, the light-shielding layer made of the opaque material may be formed on the first base substrate 100 by a physical vapor deposition (PVD) method, etc. In one embodiment, the opaque material (i.e., the light-shielding layer) may be a metal material, e.g., an aluminum layer, a tungsten layer, or a chrome layer. In another embodiment, the opaque material (i.e., the light-shielding layer) may be a metal compound conductive layer. A first photoresist layer may be formed on the light-shielding layer, and the first photoresist layer may be exposed and developed using a mask to form a patterned first photoresist layer. Then, the light-shielding layer may be etched using the patterned first photoresist layer as a mask to form the plurality of alignment marks 200 on the first base substrate 100. Ultimately, the patterned first photoresist layer may be removed through an ashing process.

In one embodiment, before or after forming the plurality of alignment marks 200, a scribe line (not illustrated) may be formed on the first base substrate 100 to facilitate to subsequently dice the first base substrate 100. In one embodiment, a second photoresist layer may be formed on the first base substrate 100, and the second photoresist layer may be exposed and developed using a mask to form a patterned second photoresist layer, which may expose the first base substrate 100 in a region of the scribe line. Then, the first base substrate 100 may be etched using the patterned second photoresist layer as a mask to form a trench. The trench may be the scribe line. Ultimately, the patterned second photoresist layer may be removed through an ashing process.

In another embodiment, the scribe line may be formed during forming the plurality of alignment marks 200. In other words, the scribe line and the plurality of alignment marks 200 may be formed in a same process. In one embodiment, the first photoresist layer may be exposed and developed using a mask to form a patterned first photoresist layer. The patterned first photoresist layer may not only expose a predetermined region for forming the alignment marks, but also expose the region of the scribe line. Then, the light-shielding layer may be etched using the patterned first photoresist layer as a mask. The light-shielding layer in the predetermined region for forming the alignment marks may be etched to form the plurality of alignment marks 200 on the first base substrate 100. At the same time, the light-shielding layer in the region of the scribe line may be etched to form the trench to constitute the scribe line. Ultimately, the patterned first photoresist layer may be removed through an ashing process.

Each alignment mark 200 may have a same shape, or a different shape. In one embodiment, a plurality of alignment marks 200 with different shapes may be formed using one mask, thereby reducing the fabrication cost of the mask and simplifying the process.

Figure 6A:
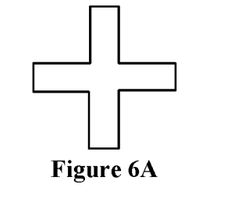
FIGS. 6A-6D illustrate schematic diagrams of exemplary alignment marks consistent with various disclosed embodiments of the present disclosure.

The shape of the alignment mark may include any combination of one or more of a cross shape, a star shape (e.g., as show in FIG. 6B) [WS1], a circle shape, an ellipse shape, a rectangle shape, and a square shape. Referring to FIG. 6A, the alignment mark 200 may have a cross shape. In one embodiment, a horizontal bar and a vertical bar of the cross shape may have a same size.

Figure 6B:
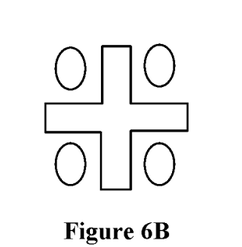

Referring to FIG. 6B, the alignment mark 200 may have a star shape, i.e., a combination of a cross shape and four ellipse shapes. In one embodiment, a horizontal bar and a vertical bar of the cross shape may have a same size, and the four ellipse shapes of the star shape may have a same size.

Figure 6C:
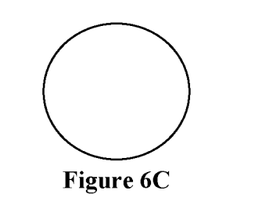
Figure 6D:
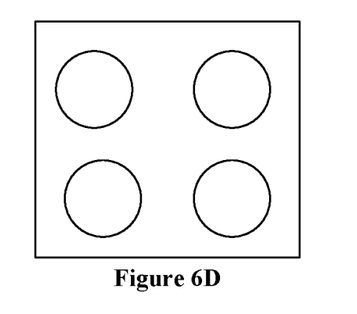

Referring to FIG. 6C, the alignment mark 200 may have a circle shape. Referring to FIG. 6D, the alignment mark 200 may have a combination shape of a square shape and a circle shape. In one embodiment, the alignment mark 200 may have a shape in which four identical circle shapes are evenly distributed in the square shape. Referring to FIGS. 6A-6D, the alignment mark may have a different shape, which is not limited by the present disclosure, and may be determined according to practical applications. The alignment mark 200 may have a shape formed by combining multiple numbers of a same shape. Alternatively, the alignment mark 200 may have a shape formed by a combination of different shapes.

A maximum size of the alignment mark 200 may be in a range of approximately 0.5 mm*0.5 mm-10 mm*10 mm. In one embodiment, when the alignment mark 200 has the shape as illustrated in FIG. 6A, a size of each of the horizontal bar and the vertical bar of the cross shape may be in a range of approximately 0.5 mm*0.5 mm-10 mm*10 mm. When the alignment mark 200 has a shape as illustrated in FIG. 6D, a size of the square shape may be in a range of approximately 0.5 mm*0.5 mm-10 mm*10 mm.

The plurality of alignment marks 200 may be evenly distributed on the first base substrate 100 to facilitate the subsequent dicing of the first base substrate 100. In another embodiment, first base substrate the alignment marks 200 of different shapes may be typeset on the first base substrate 100 to maximize the use of the first base substrate 100, as long as the first base substrate 100 can be subsequently diced to separate adjacent alignment marks 200 from each other.

After forming the plurality of alignment marks 200 on the first base substrate 100, the first base substrate 100 may be diced to form a plurality of alignment dies 300 for alignment. Each alignment die 300 may include the diced first base substrate 100 and at least one alignment mark 200 formed on the diced first base substrate 100. Each alignment die 300 may include at least one alignment mark 200. In one embodiment, referring to FIG. 4, each alignment die 300 may include one alignment mark 200. In one embodiment, the diced first base substrate 100 may have a square shape, and the alignment mark 200 may have a cross shape.

A second base substrate 400 that desires to be aligned may be provided. In one embodiment, the second base substrate 400 may be a silicon base. In another embodiment, the second base substrate may be a germanium base, a germanium silicon base, a gallium arsenide base, or a silicon-on-insulator base. Those skilled in the art may select the material of the second base substrate as needed, and, thus, the type of the second base substrate may not limit the scope of the present disclosure. In one embodiment, the second base substrate 400 may be a silicon base. The second base substrate 400 may be any suitable base that desires to be aligned, and any suitable semiconductor device may be formed on the second base substrate 400. In one embodiment, the semiconductor device may include a memory, a logic circuit, a power device, a bipolar device, a separate MOS transistor, a micro-electromechanical system (MEMS), or any suitable active device. In another embodiment, the semiconductor device may include a light-emitting diode, and any suitable photovoltaic device. In certain embodiments, the semiconductor device may include a resistor, a capacitor, or any suitable passive device, which is not limited by the present disclosure. The second base substrate 400 may be a bare base, which may be peeled off and reused after completing the subsequent alignment and bonding.

Referring to FIG. 5, a bonding film 500 may be formed on the second base substrate 400. The bonding film 500 may be formed on the second base substrate 400 using rolling, spin coating, spray coating, printing, non-rotation coating, hot pressing, vacuum pressing, dipping, pressure bonding, or any suitable method. In one embodiment, the bonding film 500 may be a temporary bonding film. In one embodiment, the bonding film may be made of a thermoplastic or thermosetting organic material. In another embodiment, the bonding film may be made of an inorganic material including Cu (copper), Ni (nickel), Cr (chromium), or Co (cobalt), etc. The bonding film may be removed by a heating method, a mechanical method, a chemical method, a laser method, a freezing method, or any suitable method. In another embodiment, the bonding film 500 may be a permanent bonding film. In one embodiment, the bonding film 500 may be a die attach film (DAF), or a dry film. In one embodiment, the die attach film may be a resin glue, especially a highly thermally conductive resin glue, for bonding. The dry film may be a polymer compound, which may undergo a polymerization reaction after being radiated by ultraviolet light to form a stable substance attached to the surface to be bonded of the second base substrate 400 for bonding.

Referring to FIG. 5, the alignment die 300 may be attached to the bonding film 500 in the alignment region of the second base substrate 400 using a die attach process. In one embodiment, the die attach process may include placing the alignment die 300 on the bonding film 500 in the alignment region of the second base substrate 400 and applying a pressure to complete the attach. During the attach process, the applied pressure may be in a range of approximately 0.1 N-5 N, a temperature while applying the pressure may be in a range of approximately 23° C.-80° C., and a duration for applying the pressure may be in a range of approximately 0.1 second-5 seconds. Therefore, the alignment die 300 may be substantially attached to the bonding film 500 on the second base substrate 400 to improve the success rate of the attach.

At least two alignment regions may be disposed on the second base substrate 400. In one embodiment, two alignment regions may be disposed on the second base substrate 400, and the two alignment regions may be disposed on opposite sides of the second base substrate 400. Each alignment die 300 may be attached to one alignment region. In one embodiment, an attach accuracy of the alignment die 300 may be smaller than or equal to 3 µm. The attach accuracy may refer to an offset of an actual attach position relative to an ideal attach position. Therefore, the alignment die 300 may be accurately attached to the alignment region to implement the alignment of the second base substrate 400 with a subsequent base, thereby improving the alignment accuracy and improving the performance of the semiconductor device.

In one embodiment, the method may further include aligning and bonding a surface of the second base substrate 400 on which the alignment die 300 is attached with a third base substrate. The second base substrate 400 may be aligned with the third base substrate through the alignment die 300, and the second base substrate 400 may be bonded to the third base substrate through the bonding film 500. The bonding may be one of a temporary bonding and a permanent bonding. When the bonding is a temporary bonding, the second base substrate 400 may be reused. In other words, after completing the alignment and the temporary bonding, and after completing subsequent processes, the second base substrate 400 may be separated from the third base substrate, and the remaining bonding film 500 and the alignment die 300 on the second base substrate 400 may be peeled off. Then, another bonding film may be formed on the second base substrate and the alignment die may be attached to the second base substrate again to perform the alignment and bonding again.

In one embodiment, the third base substrate may be made of at least one of the following semiconductor materials: Si, Ge, SiGe, SiC, SiGeC, InAs, GaAs, InP, InGaAs, other group III-V compound semiconductors, and a multilayer structure of such semiconductor materials. In another embodiment, the third base substrate may be a silicon-on-insulator (SOI), strained silicon-on-insulator (SSOI), strained silicon germanium-on-insulator (S—SiGeOI), silicon germanium-on-insulator (SiGeOI), or germanium-on-insulator (GeOI). The third base substrate may be a base that desires to be aligned and bonded. In one embodiment, any suitable semiconductor device may be formed on the third base substrate. In another embodiment, the third base substrate may be a bare base, which is not limited by the present disclosure.

In another embodiment, the fabrication method may further include attaching a chip on the surface of the second base substrate 400 on which the alignment die 300 is attached. The second base substrate 400 may be aligned with the chip through the alignment die 300, and the chip may be pasted onto the second base substrate 400 through the bonding film 500.

Referring to FIG. 1, the bonding film 30 is formed under the alignment mark 20, and the bonding film 30 needs to be cut to form the blank region 30'. Referring to FIG. 5, the alignment die 300 may be formed on the bonding film 500, and, thus, the bonding film 500 may not desire to be cut. Comparing FIG. 1 with FIG. 5, process steps and process time may be saved, the bonding film 500 may be saved, and at the same time, the usable area of the second base substrate 400 may be improved.

Further, when the bonding is a temporary bonding, for the structure illustrated in FIG. 1, after the carrier wafer 10 is peeled off, when the alignment mark 20 thereon is retained on the carrier wafer 10, the carrier wafer 10 is merely used for the same type of alignment and bonding. When the alignment mark 20 thereon is peeled off from the carrier wafer 10, the alignment mark desires to be re-formed on the carrier wafer 10. In other words, the types of alignment and bonding are limited, or the alignment mark desires to be re-formed. For the structure illustrated in FIG. 5, after the second base substrate 400 is peeled off, because the alignment die 300 is formed on the bonding film 500, the alignment die 300 may also be peeled off. Therefore, the alignment die 300 may desire to be re-attached onto the second base substrate 400, and the alignment die 300 including the alignment mark of different shapes may be attached. In other words, the second base substrate 400 may be re-used after attaching the alignment die 300, which is not limited by the types of the alignment and bonding and may not increase the process steps for forming the alignment mark. Therefore, compared with the method associated with FIG. 1, the fabrication method for forming the semiconductor device in the disclosed embodiments may improve the utilization rate of the second base substrate, may further save the process steps, reduce the production cost, and improve the production efficiency.

In the disclosed embodiments, the alignment die including the diced first base substrate and the alignment mark formed on the diced first base substrate may desire to be attached onto the second base substrate. In the prior art, the alignment mark is directly formed on the base that desires to be aligned. A thickness of the alignment die in the disclosed embodiments may be greater than a thickness of the alignment mark in the prior art. Therefore, a thickness of the carrier base may not be too thick, otherwise the too thick thickness of the alignment die may affect the subsequent alignment. On the other hand, the thickness of the carrier base may not be too thin, otherwise the formation of alignment mark on the carrier base may be affected. Therefore, the thickness of the carrier base may be determined according to practical applications.

Accordingly, in the fabrication method for forming the semiconductor device in the disclosed embodiments, the first base substrate 100 may be provided, and the plurality of alignment marks 200 may be formed on the first base substrate 100. Then, the first base substrate 100 may be diced to form the plurality of alignment dies 300 for alignment. Each alignment die 300 may include the diced first base substrate 100 and at least one alignment mark 200 formed on the diced first base substrate 100. In addition, a second base substrate 400 that desires to be aligned may be provided, and the bonding film 500 may be formed on the second base substrate 400. Moreover, the alignment die 300 may be attached onto the bonding film 500 in the alignment region of the second base substrate 400 through the die attach process.

In the disclosed embodiments, the plurality of alignment dies 300 each including at least one alignment mark 200 may be first formed. When the second base substrate 400 desires to be aligned, the alignment die 300 may desire to be attached onto the second base substrate 400. The alignment mark may not desire to be formed on the second base substrate 400 using a mask every time, which may save the process steps, reduce the production cost, and improve the production efficiency. Moreover, before attaching the alignment die 300 onto the second base substrate 400, the bonding film 500 may be formed on the second base substrate 400. The alignment die 300 may be formed on the bonding film 500, and, thus, the bonding film 500 may be prevented from being cut. Therefore, the process steps may be saved, the bonding film 500 may be saved, and at the same time, the usable area of the second base substrate 400 may be improved.

Correspondingly, the present disclosure also provides a semiconductor device formed by the disclosed fabrication method. Referring to FIGS. 4-5, the semiconductor device may include a second base substrate 400, where a bonding film 500 may be formed on the second base substrate 400; and an alignment die 300 used for aligning the second base substrate 400, where the alignment die 300 may be formed on the bonding film 500 in an alignment region of the second base substrate 400. The alignment die 300 may include diced first base substrate 100 and at least one alignment mark 200 formed on the diced first base substrate 100. The diced first base substrate 100 may be attached to the bonding film 500.

Referring to FIGS. 4-5, the alignment mark 200 may have a cross shape. In another embodiment, the shape of the alignment mark may include any combination of one or more of a star shape, a circle shape, an ellipse shape, a rectangle shape, and a square shape. Referring to FIG. 6A, the alignment mark 200 may have a cross shape. In one embodiment, a horizontal bar and a vertical bar of the cross shape may have a same size.

Referring to FIG. 6B, the alignment mark 200 may have a star shape, i.e., a combination of a cross shape and four ellipse shapes. In one embodiment, a horizontal bar and a vertical bar of the cross shape may have a same size, and the four ellipse shapes of the star shape may have a same size.

Referring to FIG. 6C, the alignment mark 200 may have a circle shape. Referring to FIG. 6D, the alignment mark 200 may have a combination shape of a square shape and a circle shape. In one embodiment, the alignment mark 200 may have a shape in which four identical circle shapes are evenly distributed in the square shape. Referring to FIGS. 6A-6D, the alignment mark may have a different shape, which is not limited by the present disclosure, and may be determined according to practical applications. The alignment mark 200 may have a shape of a combination of a plurality of numbers of a same shape or a combination of different shapes.

A maximum size of the alignment mark 200 may be in a range of approximately 0.5 mm*0.5 mm-10 mm*10 mm. In one embodiment, when the alignment mark 200 has the shape as illustrated in FIG. 6A, a size of each of the horizontal bar and the vertical bar of the cross shape may be in a range of approximately 0.5 mm*0.5 mm-10 mm*10 mm. When the alignment mark 200 has the shape as illustrated in FIG. 6D, a size of the square shape may be in a range of approximately 0.5 mm*0.5 mm-10 mm*10 mm.

The first base substrate 100 may be a semiconductor material base substrate. In one embodiment, the first base substrate 100 may be a silicon base. In another embodiment, the first base substrate may be a germanium base, a germanium silicon base, a gallium arsenide base, or a silicon-on-insulator base. Those skilled in the art may select the material of the first base substrate 100 as needed, and, thus, the type of the first base substrate 100 may not limit the scope of the present disclosure. In one embodiment, the first base substrate 100 may be a silicon base.

At least two alignment regions may be disposed on the second base substrate 400. In one embodiment, two alignment regions may be disposed on opposite sides of the second base substrate 400. Referring to FIG. 5, the second base substrate 400 may have a circle shape. The two alignment regions may be disposed at any two points of a diameter of the alignment base 400, and two alignment dies 300 may be disposed in the two alignment regions, respectively.

Further, the semiconductor device may include a third base substrate. The third base substrate may be aligned and boned to a surface of the second base substrate 400 on which the alignment die 300 is attached. In another embodiment, the semiconductor device may include a chip attached to the surface of the second base substrate 400 on which the alignment die 300 is attached.

Correspondingly, the present disclosure also provides a fabrication method for forming an alignment mark. The fabrication method for forming the alignment mark may include providing a semiconductor material base substrate, and forming a plurality of alignment marks on the semiconductor material base substrate. The plurality of alignment marks may be distributed throughout the semiconductor material base substrate.

In one embodiment, a light-shielding layer made of an opaque material may be formed on the semiconductor material base substrate. In one embodiment, the light-shielding layer made of the opaque material may be formed on the semiconductor material base substrate by a physical vapor deposition (PVD) method, etc. In one embodiment, the opaque material (i.e., the light-shielding layer) may be a metal material, e.g., an aluminum layer, a tungsten layer, or a chrome layer. In another embodiment, the opaque material (i.e., the light-shielding layer) may be a metal compound conductive layer. A first photoresist layer may be formed on the light-shielding layer, and the first photoresist layer may be exposed and developed using a mask to form a patterned first photoresist layer. Then, the light-shielding layer may be etched using the patterned first photoresist layer as a mask to form the plurality of alignment marks on the semiconductor material base substrate. The plurality of alignment marks may be distributed throughout the semiconductor material base substrate. Ultimately, the patterned first photoresist layer may be removed through an ashing process.

In one embodiment, before or after forming the plurality of alignment marks, a scribe line (not illustrated) may be formed on the semiconductor material base substrate to facilitate to subsequently dice the semiconductor material base substrate. In one embodiment, a second photoresist layer may be formed on the semiconductor material base substrate, and the second photoresist layer may be exposed and developed using a mask to form a patterned second photoresist layer, which may expose the semiconductor material base substrate in a region of the scribe line. Then, the semiconductor material base substrate may be etched using the patterned second photoresist layer as a mask to form a trench. The trench may be the scribe line. Ultimately, the patterned second photoresist layer may be removed through an ashing process.

In another embodiment, the scribe line may be formed during forming the plurality of alignment marks. In other words, the scribe line and the plurality of alignment marks may be formed in a same process. In one embodiment, the first photoresist layer may be exposed and developed using a mask to form a patterned first photoresist layer, and the patterned first photoresist layer may not only expose a predetermined region for forming the alignment marks, but also expose the region of the scribe line. Then, the light-shielding layer may be etched using the patterned first photoresist layer as a mask. The light-shielding layer in the predetermined region for forming the alignment marks may be etched to form the plurality of alignment marks on the semiconductor material base substrate, and at the same time, the light-shielding layer in the region of the scribe line may be etched to form the trench to constitute the scribe line. Ultimately, the patterned first photoresist layer may be removed through an ashing process.

The fabrication method for forming the alignment mark may further include after forming the plurality of alignment marks, dicing the semiconductor material base substrate to form a plurality of alignment dies for alignment. When the alignment and bonding are subsequently desired, after forming a bonding film on a base that desires to be bonded, the alignment die may be directly attached to the alignment region of the base that desires to be bonded. The alignment of the base that desires to be bonded may be completed using the alignment die, and, thus, the alignment mark may not desire to be formed on the base using a mask every time, which may save the process steps, reduce the production cost, and improve the production efficiency. Further, because the alignment die is formed on the bonding film, the bonding film may be prevented from being cut. Therefore, the process steps may be saved, the bonding film may be saved, and at the same time, the usable area of the second base substrate may be improved.

Accordingly, in the semiconductor device and fabrication method thereof, and the fabrication method for forming the alignment mark in the disclosed embodiments, the plurality of alignment dies each including at least one alignment mark may be first formed. When the second base substrate desires to be aligned, the alignment die may desire to be attached onto the second base substrate. The alignment mark may not desire to be formed on the second base substrate using a mask every time, which may save the process steps, reduce the production cost, and improve the production efficiency. Moreover, before attaching the alignment die onto the second base substrate, the bonding film may be formed on the second base substrate. The alignment die may be formed on the bonding film, and, thus, the bonding film may be prevented from being cut. Therefore, the process steps may be saved, the bonding film may be saved, and at the same time, the usable area of the second base substrate may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor device, comprising:
   providing a first base substrate;
   forming a plurality of alignment marks on the first base substrate;
   dicing the first base substrate to form a plurality of alignment dies, wherein each alignment die includes a diced first base substrate and at least one alignment mark diced from the plurality of alignment marks on the diced first base substrate;
   providing a second base substrate for aligning;
   forming a bonding film on the second base substrate;
   forming an alignment mark for the second base substrate by attaching an alignment die of the plurality of alignment dies to the bonding film on an alignment region of the second base substrate using a die attach process, and
   attaching a chip on a surface of the second base substrate on which the alignment die is attached.

2. A method for forming a semiconductor device, comprising:
   providing a first base substrate;
   forming a plurality of alignment marks on the first base substrate;
   dicing the first base substrate to form a plurality of alignment dies, wherein each alignment die includes a diced first base substrate and at least one alignment mark diced from the plurality of alignment marks on the diced first base substrate;
   providing a second base substrate for aligning;
   forming a bonding film on the second base substrate;
   attaching an alignment die of the plurality of alignment dies to the bonding film on an alignment region of the second base substrate using a die attach process; and
   aligning and bonding a third base substrate with a surface of the second base substrate on which the alignment die is attached.

3. The method according to claim 2, wherein:
   the bonding of the third base substrate with the second base substrate is a temporary bonding; and
   after separating the second base substrate from the third base substrate, another bonding film is applied on the second base substrate and another alignment die is attached onto the second base substrate to perform additional aligning and bonding of another base substrate with the second base substrate.

4. A method for forming an alignment mark, comprising:
   providing a semiconductor material base substrate;
   forming a plurality of alignment marks on the semiconductor material base substrate, wherein the plurality of alignment marks are distributed throughout the semiconductor material base substrate;
   dicing the semiconductor material base substrate to form a plurality of alignment dies to form a plurality of alignment marks for a carrier wafer, and
   attaching a chip on a surface of the second base substrate on which the alignment die is attached.

5. The method according to claim 2, further including:
   attaching a chip on a surface of the second base substrate on which the alignment die is attached.

6. The method according to claim 2, wherein the die attach process includes:

placing the alignment die on the bonding film in the alignment region of the second base substrate, and applying a pressure on one or more of the alignment die and the second base substrate.

7. The method according to claim 6, wherein:

an applied pressure is in a range of approximately 0.1 N-5 N, a temperature for applying the pressure is in a range of approximately 23° C.-80° C., and a duration for applying the pressure is in a range of approximately 0.1 second-5 seconds.

8. The method according to claim 2, wherein:

the first base substrate is a semiconductor material base substrate, and the bonding film is made of one of a thermoplastic organic material, a thermosetting organic material, an inorganic material, a die attach film, and a dry film, wherein the inorganic material includes copper, nickel, chromium, cobalt, or a combination thereof.

9. The method according to claim 1, wherein the die attach process includes:

placing the alignment die on the bonding film in the alignment region of the second base substrate, and applying a pressure on one or more of the alignment die and the second base substrate.

10. The method according to claim 9, wherein:

an applied pressure is in a range of approximately 0.1 N-5 N, a temperature for applying the pressure is in a range of approximately 23° C.-80° C., and a duration for applying the pressure is in a range of approximately 0.1 second-5 seconds.

11. The method according to claim 1, wherein:

the first base substrate is a semiconductor material base substrate, and the bonding film is made of one of a thermoplastic organic material, a thermosetting organic material, an inorganic material, a die attach film, and a dry film, wherein the inorganic material includes copper, nickel, chromium, cobalt, or a combination thereof.

12. The method according to claim 1, wherein forming the plurality of alignment marks on the first base substrate includes:

forming a light-shielding layer on the first base substrate;

forming a first photoresist layer on the light-shielding layer;

patterning the first photoresist layer;

etching the light-shielding layer using the patterned first photoresist layer as a mask to form the plurality of alignment marks; and removing the patterned first photoresist layer.

13. The method according to claim 12, further including:

forming a scribe line on the first base substrate, wherein the scribe line and the plurality of alignment marks are formed in a same process; and while etching the light-shielding layer, simultaneously etching the light-shielding layer corresponding to a region of the scribe line to form a trench in the first base substrate, the trench being the scribe line.

14. The method according to claim 12, before or after forming the plurality of alignment marks, further including:

forming a second photoresist layer on the first base substrate;

patterning the second photoresist layer to expose the first base substrate corresponding to a region of a scribe line;

etching the first base substrate using the patterned second photoresist layer as a mask to form a trench in the first base substrate, the trench being the scribe line; and removing the patterned second photoresist layer.

15. The method according to claim 1, wherein:

at least two alignment regions are arranged on the second base substrate; and two alignment regions of the at least two alignment regions are arranged on opposite sides of the second base substrate.

16. The method according to claim 1, wherein:

an attach accuracy of the alignment die is smaller than or equal to about 3 µm.

17. The method according to claim 1, wherein:

a shape of an alignment mark of the plurality of alignment marks includes one or more of a cross shape, a star shape, a circle shape, an ellipse shape, a rectangle shape, and a square shape.

18. The method according to claim 1, wherein:

a maximum size of an alignment mark of the plurality of alignment marks is in a range of approximately 0.5 mm*0.5 mm to 10 mm*10 mm.

19. The method according to claim 4, wherein forming the plurality of alignment marks includes:

forming a light-shielding layer on the first base substrate;

forming a first photoresist layer on the light-shielding layer;

patterning the first photoresist layer;

etching the light-shielding layer using the patterned first photoresist layer as a mask to form the plurality of alignment marks; and removing the patterned first photoresist layer.

\* \* \* \* \*